(12) United States Patent
Tokoro et al.

(10) Patent No.: US 6,991,686 B2
(45) Date of Patent: Jan. 31, 2006

(54) METHOD FOR PRODUCING MAGNETOSTRICTIVE MATERIAL

(75) Inventors: Seigo Tokoro, Tokyo (JP); Teruo Mori, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/042,324

(22) Filed: Jan. 25, 2005

(65) Prior Publication Data

US 2005/0178473 A1    Aug. 18, 2005

(30) Foreign Application Priority Data

Jan. 26, 2004    (JP)    ............... 2004-016595

(51) Int. Cl.
  *H01F 1/053*    (2006.01)
  *H01F 1/08*    (2006.01)
(52) U.S. Cl. .................. 148/104; 419/19; 419/20; 419/23; 419/30; 419/34; 148/101; 148/102; 148/103
(58) Field of Classification Search .............. None
  See application file for complete search history.

(56) References Cited

U.S. PATENT DOCUMENTS 3,949,351 A    4/1976    Clark et al.
4,152,178 A    5/1979    Malekzadeh et al.
4,308,474 A    12/1981    Savage et al.
4,375,372 A    3/1983    Koon et al.
6,273,966 B1 *    8/2001    Snodgrass et al. .......... 148/301
2001/0018938 A1 *    9/2001    Arai et al. ................. 148/301
2003/0190250 A1 *    10/2003    Mori et al. ................ 419/58

FOREIGN PATENT DOCUMENTS

JP    07-286249    10/1995
JP    2002-129274    5/2002

* cited by examiner

*Primary Examiner*—John P Sheehan
(74) *Attorney, Agent, or Firm*—Hogan & Hartson, LLP

(57) ABSTRACT

To provide a method for producing a magnetostrictive material of excellent magnetostrictive characteristics.

The method for producing a magnetostrictive material, wherein a mixture composed of Starting Materials A, B and C is sintered, where A is represented by Formula 1 ($Tb_x Dy_{1-x})T_y$ (T is at least one metallic element selected from the group consisting of Fe, Ni and Co, $0.35 < x \leq 0.50$ and $1.70 \leq y \leq 2.00$), B is represented by Formula 2 $Dy_t T_{1-t}$ ($0.37 \leq t \leq 1.00$), and C contains T, to produce a magnetostrictive material represented by Formula 3 ($Tb_v Dy_{1-v})T_w$ ($0.27 \leq v < 0.50$, and $1.70 \leq w \leq 2.00$), wherein oxygen content is set at 500 to 3,000 ppm for Starting Material A and at 2,000 to 7,000 ppm for Starting Material B.

6 Claims, 5 Drawing Sheets

| Oxygen Content (ppm) | | | $\lambda_{1.0}$ | Releasing Pressure |
|---|---|---|---|---|
| Starting Material A | Starting Material B | Starting Material C | (ppm) | (ton/cm$^2$) |
| 1020 | 4950 | 2010 | 1150 | 2.6 |
| 2030 | 5010 | 2000 | 1050 | 2.4 |
| 2950 | 4980 | 1950 | 1000 | 2.2 |
| 3950 | 4990 | 1980 | 650 | 2.0 |
| 5040 | 5030 | 1980 | 400 | 1.8 |

FIG. 2

| Oxygen Content (ppm) | | | $\lambda_{1.0}$ | Releasing Pressure |
|---|---|---|---|---|
| Starting Material A | Starting Material B | Starting Material C | (ppm) | (ton/cm$^2$) |
| 1020 | 4950 | 2010 | 1150 | 2.6 |
| 2030 | 5010 | 2000 | 1050 | 2.4 |
| 2950 | 4980 | 1950 | 1000 | 2.2 |
| 3950 | 4990 | 1980 | 650 | 2.0 |
| 5040 | 5030 | 1980 | 400 | 1.8 |

FIG. 3

| Oxygen Content (ppm) | | | $\lambda_{1.0}$ | Releasing Pressure |
|---|---|---|---|---|
| Starting Material A | Starting Material B | Starting Material C | (ppm) | (ton/cm$^2$) |
| 1980 | 1950 | 2100 | 1200 | 4.0 |
| 2010 | 2850 | 1950 | 1170 | 2.9 |
| 2000 | 4100 | 2000 | 1150 | 2.7 |
| 2030 | 5050 | 1950 | 1080 | 2.6 |
| 2990 | 6010 | 1980 | 1050 | 2.5 |
| 1980 | 6950 | 2100 | 1000 | 1.8 |
| 1995 | 8010 | 1950 | 900 | 1.1 |

FIG. 4

| Oxygen Content (ppm) | | | $\lambda_{1.0}$ | Releasing Pressure |
|---|---|---|---|---|
| Starting Material A | Starting Material B | Starting Material C | (ppm) | (ton/cm$^2$) |
| 980 | 5020 | 2100 | 1200 | 2.8 |
| 2010 | 4980 | 1950 | 1100 | 2.4 |
| 2960 | 7990 | 1990 | 1050 | 1.8 |
| 4000 | 5020 | 1980 | 700 | 2.0 |
| 4960 | 5010 | 2020 | 500 | 1.7 |

FIG. 5

| Oxygen Content (ppm) | | | $\lambda_{1.0}$ | Releasing Pressure |
|---|---|---|---|---|
| Starting Material A | Starting Material B | Starting Material C | (ppm) | (ton/cm$^2$) |
| 2020 | 1900 | 2010 | 1250 | 4.2 |
| 2030 | 3030 | 2000 | 1240 | 2.7 |
| 2010 | 3980 | 1950 | 1200 | 2.6 |
| 2000 | 4990 | 1980 | 1100 | 2.5 |
| 2030 | 5980 | 2050 | 1080 | 2.3 |
| 1980 | 6850 | 1970 | 1030 | 1.5 |
| 2010 | 7960 | 2030 | 900 | 1.0 |

FIG. 6

| Oxygen Content (ppm) | | | $\lambda_{1.0}$ | Releasing Pressure |
|---|---|---|---|---|
| Starting Material A | Starting Material B | Starting Material C | (ppm) | (ton/cm$^2$) |
| 980 | 5000 | 1990 | 1220 | 2.8 |
| 2000 | 4980 | 2030 | 1120 | 2.3 |
| 2950 | 4990 | 1980 | 1070 | 1.8 |
| 4020 | 5010 | 1990 | 800 | 2.0 |
| 5010 | 5050 | 2010 | 600 | 1.9 |

FIG. 7

| Oxygen Content (ppm) | | | $\lambda_{1.0}$ | Releasing Pressure |
|---|---|---|---|---|
| Starting Material A | Starting Material B | Starting Material C | (ppm) | (ton/cm$^2$) |
| 2020 | 1930 | 2100 | 1260 | 4.3 |
| 2010 | 2800 | 1980 | 1250 | 2.9 |
| 1990 | 4000 | 2050 | 1220 | 2.6 |
| 2010 | 5010 | 1950 | 1120 | 2.5 |
| 2000 | 6010 | 1980 | 1100 | 2.3 |
| 2010 | 6850 | 1990 | 1050 | 1.6 |
| 2000 | 7950 | 2010 | 900 | 1.1 |

FIG. 8

| Oxygen Content (ppm) | | | $\lambda_{1.0}$ (ppm) | Releasing Pressure (ton/cm$^2$) |
|---|---|---|---|---|
| Starting Material A | Starting Material B | Starting Material C | | |
| 990 | 4950 | 2000 | 1200 | 2.7 |
| 2010 | 4980 | 2030 | 1050 | 2.3 |
| 2890 | 5010 | 2000 | 1010 | 1.9 |
| 3960 | 5030 | 1980 | 700 | 2.0 |
| 5010 | 5050 | 2010 | 500 | 2.0 |

FIG. 9

| Oxygen Content (ppm) | | | $\lambda_{1.0}$ (ppm) | Releasing Pressure (ton/cm$^2$) |
|---|---|---|---|---|
| Starting Material A | Starting Material B | Starting Material C | | |
| 2000 | 1870 | 2010 | 1230 | 4.5 |
| 2000 | 3010 | 2000 | 1200 | 2.7 |
| 2000 | 3980 | 1950 | 1170 | 2.6 |
| 1990 | 5000 | 1980 | 1050 | 2.5 |
| 2020 | 5980 | 2010 | 1030 | 2.3 |
| 2030 | 6950 | 1990 | 1000 | 1.7 |
| 2100 | 8020 | 1980 | 800 | 1.0 |

METHOD FOR PRODUCING MAGNETOSTRICTIVE MATERIAL

BACKGROUND OF THE INVENTION

1. Field of the Invention

The present invention relates to a method for producing a magnetostrictive material which changes in length when subjected to an external magnetic field, in particular a method for producing a material of excellent magnetostrictive characteristics by controlling oxygen content of the starting material powder to be sintered into a magnetostrictive material.

2. Description of the Related Art

Magnetostriction is a phenomenon of a ferromagnetic material to undergo a dimensional change when magnetized, and a magnetostrictive material is a material which exhibits this phenomenon. Saturation magnetostrictive constant, which represents a dimensional change at saturation by magnetostriction, is generally in a range from $10^{-5}$ to $10^{-6}$, and a magnetostrictive material having a high saturation magnetostrictive constant is sometimes referred to as a supermagnetostrictive material. These materials are widely used for vibrators, filters, sensors, and the like. At present, a magnetostrictive material based on a laves type intermetallic compound of $RFe_2$ which is a compound of R (rare-earth element) and Fe is known to have a high saturation magnetostrictive constant (refer to U.S. Pat. Nos. 3,949,351, 4,152,178, 4,308,474 and 4,375,372). These materials, however, involve problems of insufficient magnetostrictive value in an external magnetic field of low intensity, although exhibiting a high value when applied to a field of high intensity. Therefore, magnetostrictive materials based on a laves type intermetallic compound of $RFe_2$ have been studied to have a higher magnetostrictive value even in an external magnetic field of low intensity, and it is proposed to orient the material along the [111] axis as an easy-magnetization axis of high magnetostrictive constant. Magnetostrictive materials based on a laves type intermetallic compound of $RFe_2$ exhibit a high magnetostrictive value at a composition of $Tb_{0.3}Dy_{0.7}Fe_{2.0}$ (atomic ratio), and this composition has been used exclusively.

JP-A 7-286249 proposes a method for producing a magnetostrictive material, where a mixture of three types of alloy powders, A: composed of Tb, Dy and T (iron group element) B: composed of Dy, Tb and T, and C: composed of T, is sintered to secure a high degree of orientation when compacted in a magnetic field. This method, however, involves problems such that density of the sintered magnetostrictive material being not always sufficient.

In order to solve these problems, JP-A 2002-129274 proposes a method for producing a magnetostrictive material by sintering a mixture composed of Starting Materials A, B and C, where Starting Material A is represented by Formula 1 $(Tb_xDy_{1-x})T_y$ (T is at least one metallic element selected from the group consisting of Fe, Ni and Co, $0.35<x\leq 0.50$ and $1.70\leq y\leq 2.00$), Starting Material B is represented by Formula 2 $Dy_tT_{1-t}$ (Dy may contain Tb and/or Ho, and $0.37\leq t \leq 1.00$) and contains hydrogen at 7000 to 22000 ppm, inclusive, and C contains T, to produce a magnetostrictive material represented by Formula 3 $(Tb_vDy_{1-v})T_w$ ($0.27\leq v<0.50$, and $1.70\leq w\leq 2.00$).

JP-A 2002-129274 discusses that Starting Material B, when hydrogen is absorbed therein, has the particles cracked by internal stresses resulting from the strains which the hydrogen atoms cause either by forming a hydride or penetrating into the crystal structure. When a mixture of Starting Materials A, B and C is formed into a compact under pressure, the stresses are concentrated at the cracked edges to further propagate the cracks, with the result that the compact is sintered more densely by virtue of the finely divided particles penetrating into interspaces between the Starting Material A particles.

The method for producing a magnetostrictive material proposed by Japanese Patent Laid-Open No. 2002-129274, however, involves releasability-related problems, because it needs a high pressure for releasing a compact from a die (hereinafter referred to as releasing pressure). Use of a lubricant for reducing releasing pressure is one approach to those problems. This, however, tends to deteriorate the magnetostrictive characteristics of the product, because it can allow carbon to remain massively in the form of carbide phase in the sintered body, which inhibits elongation of the magnetostrictive material.

SUMMARY OF THE INVENTION

It is an object of the present invention to provide a method for producing a magnetostrictive material of excellent magnetostrictive characteristics with reducing the releasing pressure.

The inventors of the present invention have found that the magnetostrictive characteristics vary with oxygen content of Starting Materials A and B, and that the releasing pressure is closely related to the oxygen content of Starting Material B. Also the present inventors have found that the magnetostrictive characteristics are excellent and the releasing pressure is reduced when Starting Material B in particular contains oxygen at a higher content than that specified by JP-A 2002-129274. The method of the present invention for producing a magnetostrictive material, achieved based on these findings, sinters a mixture composed of Starting Materials A, B and C, where A is represented by Formula 1 $(Tb_xDy_{1-x})T_y$ (T is at least one metallic element selected from the group consisting of Fe, Ni and Co, $0.35<x\leq 0.50$ and $1.70\leq y\leq 2.00$), B is represented by Formula 2 $Dy_tT_{1-t}$ ($0.37\leq t\leq 1.00$), and C contains T, to produce a magnetostrictive material represented by Formula 3 $(Tb_vDy_{1-v})T_w$ ($0.27\leq v<0.50$, and $1.70\leq w\leq 2.00$), wherein oxygen content is set at 500 to 3000 ppm for Starting Material A and at 2000 to 7000 ppm for Starting Material B. Dy for Starting Material B may be partly substituted by Tb or Ho.

It is preferable in the present invention that oxygen content is set at 1000 to 2500 ppm for Starting Material A, at 3000 to 5000 ppm for Starting Material B and at 500 to 3000 ppm for Starting Material C.

It is also preferable in the present invention that Starting Material B contains hydrogen at 7000 to 22000 ppm.

The present invention can provide a magnetostrictive material of excellent magnetostrictive characteristics with reducing the releasing pressure, by controlling oxygen content of each of Starting Materials A, B, and furthermore C.

BRIEF DESCRIPTION OF THE DRAWINGS

FIG. 2 is a table showing the relation between magnetostrictive value and releasing pressure with regard to a sintered body of the composition a.

FIG. 3 is a table showing the relation between magnetostrictive value and releasing pressure with regard to a sintered body of the composition a.

FIG. 4 is a table showing the relation between magnetostrictive value and releasing pressure with regard to a sintered body of the composition b.

FIG. 5 is a table showing the relation between magnetostrictive value and releasing pressure with regard to a sintered body of the composition b.

FIG. 6 is a table showing the relation between magnetostrictive value and releasing pressure with regard to a sintered body of the composition c.

FIG. 7 is a table showing the relation between magnetostrictive value and releasing pressure with regard to a sintered body of the composition c.

FIG. 8 is a table showing the relation between magnetostrictive value and releasing pressure with regard to a sintered body of the composition d.

FIG. 9 is a table showing the relation between magnetostrictive value and releasing pressure with regard to a sintered body of the composition d.

DETAILED DESCRIPTION OF THE PREFERRED EMBODIMENTS

Figure 1:
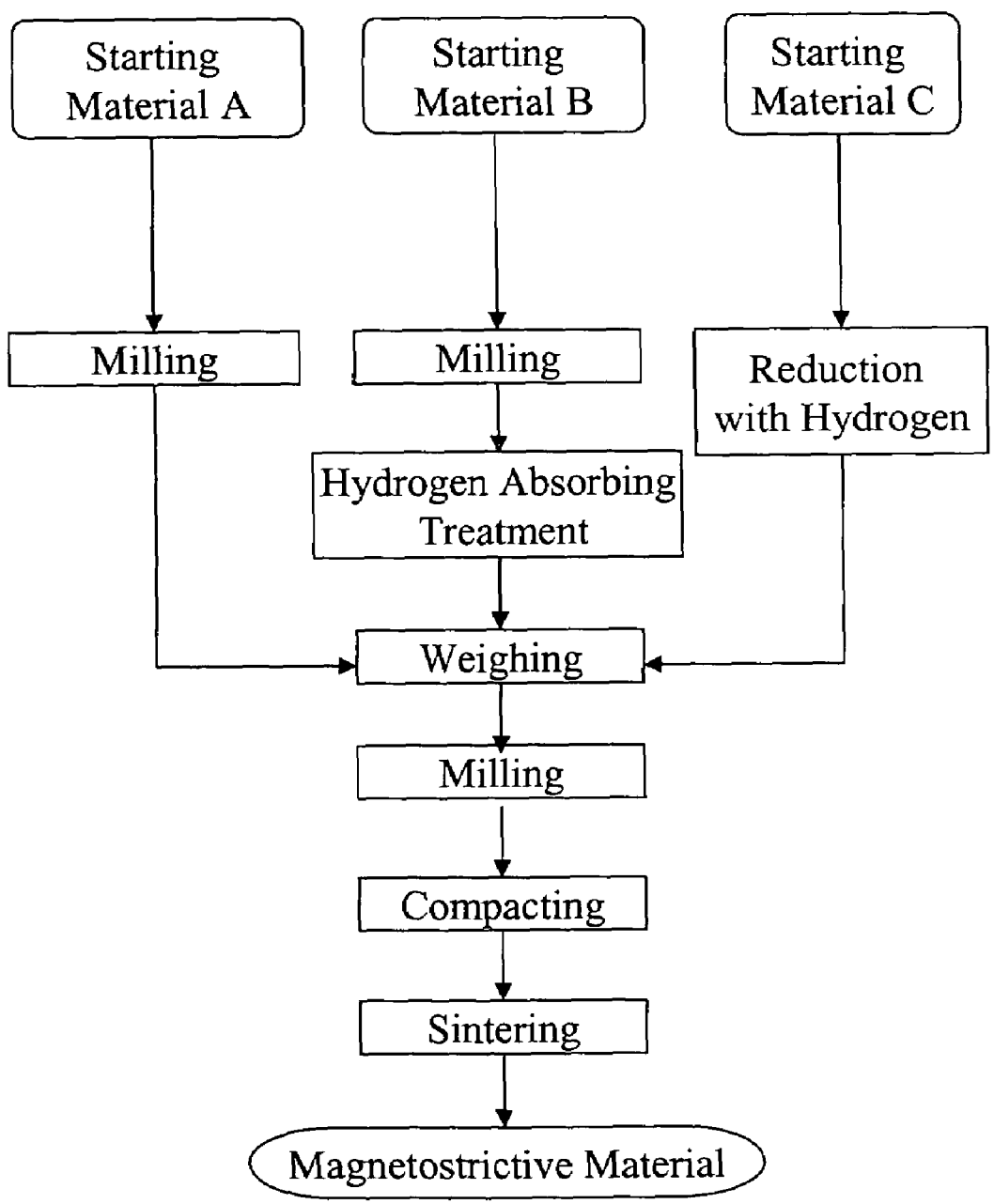
FIG. 1 shows a flow chart of one embodiment of the method of the present invention for producing a magnetostrictive material.

The embodiments of the present invention are described by referring to the attached drawings.

FIG. 1 shows a flow chart of one embodiment of the method of the present invention for producing a magnetostrictive material.

The method of the present invention for producing a magnetostrictive material uses Starting Material A represented by Formula 1 $(Tb_xDy_{1-x})T_y$, wherein T is at least one metallic element selected from the group consisting of Fe, Co and Ni, and in particular may be singly Fe, because Fe forms $(Tb, Dy)Fe_2$, an intermetallic compound of high magnetostrictive characteristics, with Tb and Dy. Fe may be partly substituted by Co or Ni. In this case, however, Fe preferably accounts for 70% by weight or more, more preferably 80% or more, because Co decreases permeability although increasing magnetic anisotropy, while Ni decreases Curie temperature to decrease magnetostrictive value at room temperature and in a high magnetic field. Moreover, T may contain a transition metal element which forms an alloy with a rare-earth metal of Tb, Dy or Ho. More specifically, Mn, Cr, Mo or W may be incorporated as a transition metal element. Tb as a constituent of Starting Material A may be partly substituted by rare-earth metal element (R') other than Dy and Ho. For example, R' may be Nd, Pr, Gd, Y or the like.

In Formula 1, x and y are each in the following range; $0.35 < x \leq 0.50$ and $1.70 \leq y \leq 2.00$. When x is below 0.35, the sintered magnetostrictive material has low degree of orientation in the [111] axis. When it is above 0.50, on the other hand, content of Starting Material A in the whole magnetostrictive material decreases to decrease its degree of orientation in the [111] axis. When y is below 1.70, degree of orientation of the sintered magnetostrictive material in the [111] axis decreases, because mixing ratio of Starting Material C should be increased, which results in decreased ratio of Starting Material A. When y is above 2.00, on the other hand, the Fe-rich phases, e.g., $(Tb,Dy)T_3$, increase which in turn decreases degree of orientation of the compact formed in a magnetic field and hence degree of orientation in the sintered magnetostrictive material is decreased. It is more preferably $0.37 \leq x \leq 0.45$, $1.85 \leq y \leq 1.98$.

In the present invention, oxygen content of Starting Material A is controlled at 500 to 3000 ppm, because it is difficult to control oxygen content below 500 ppm on an industrial scale, and oxygen content above 3000 ppm may decrease magnetostrictive value. It is preferably 1000 to 2500 ppm, more preferably 1000 to 2000 ppm.

Starting Material A preferably has a particle size (mean particle size) of 1 to 200 μm for the present invention. It affects the magnetostrictive characteristics, and serves as a main phase in the sintered magnetostrictive material. When the particle size of Starting Material A is smaller, it is difficult to rotate the particles thereof in a magnetic field to reduce degree of orientation, and also increase oxygen content due to increased specific surface area. A dissimilar phase formed in the presence of oxygen decreases content of the main phase to deteriorate magnetostrictive characteristics. On the other hand, when the particle size of Starting Material A is larger, two or more crystallites are contained in each particle thereof to prevent improvement of degree of orientation, and also prevent densification of the compact. Therefore, the mean particle size of Starting Material A is preferably between 1 and 200 μm, more preferably between 2 and 100 μm, still more preferably between 5 and 50 μm. The mean particle size is determined by an analyzer (Fisher's Subsieve Sizer).

The method of the present invention for producing a magnetostrictive material also uses Starting Material B represented by Formula 2 $Dy_tT_{1-t}$, wherein T is at least one metallic element selected from the group consisting of Fe, Co and Ni. In particular, T may be singly Fe. In this case, Fe may be partly substituted by Co or Ni, because the crushability of Starting Material B is improved when it is partly substituted with Fe to increase density of the sintered body. Dy for Starting Material B may be partly substituted by Tb or Ho. In Formula 2, t is in the range of $0.37 \leq t \leq 1.00$. Dy and T have an eutectic point, and a mixture of Starting Materials A, B and C has a decreased content of $R_2T$ as an eutectic composition, when t does not fall within the above range, preventing densification of the sintered body. It is more preferably $0.5 \leq t \leq 0.8$, still more preferably $0.6 \leq t \leq 0.7$.

Starting Material B should contain hydrogen from 7000 to 22000 ppm, both inclusive. Starting Material B becomes fragile as it absorbs hydrogen, and is finely divided more easily when a mixture of Starting Materials A, B and C is formed into a compact under pressure, with the result that the compact is sintered more densely by virtue of the finely divided Starting Material B particles penetrating into interspaces between the Starting Material A particles.

It is recommended that Starting Material B absorbs hydrogen at 7000 to 22000, inclusive. Below 7000 ppm, the Starting Material B particles may have insufficient internal strains because of insufficient quantity of hydrogen, with the result that they may be cracked insufficiently while being formed into the compact, densified insufficiently and have more open pores. Moreover, the product magnetostrictive material may have more deteriorated magnetostrictive characteristics while being in service for extended periods. On the other hand, increasing hydrogen content beyond 22000 ppm has little effect on milling of the particles.

Oxygen content of Starting Material B should be from 2000 to 7000 ppm for the present invention. Starting Material B contains more R than Starting Material A, and is very reactive. A mixture may be ignited while being compacted, when it contains very reactive Starting Material B. Moreover, it tends to react with other elements, e.g., carbon, when it is very reactive, to cause deterioration or dispersions of magnetostrictive characteristics. Consequently, Starting Material B is prepared before hand to contain oxygen at 2000 ppm or more to reduce its reactivity.

The oxygen content of Starting Material B has a significant effect on releasing pressure. When it is below 2000 ppm, the powder is sufficiently active and tends to deposit on the die walls, with the result that a releasing pressure of 3.0 tons/cm² or more is needed. Increasing the releasing pressure to the above level will cause some problems, e.g., a shorter service life of the die and a decreased yield of the product resulting from increased chipped or cracked compact. At the oxygen content of 2000 ppm or more, on the other hand, the releasing pressure can be reduced without using a lubricant, which can adversely affect the magnetostrictive characteristics.

However, presence of oxygen at an excessively high content deters realization of high magnetostrictive characteristics. Consequently, oxygen content of Starting Material B is set at 2000 to 7000 ppm, preferably 3000 to 6000 ppm, still more preferably 4000 to 5500 ppm.

Moreover, it is preferable to set particle size (mean particle size) of Starting Material B at 0.1 to 100 μm for the present invention. Starting Material B mainly forms the grain boundary phase after being sintered. Its oxygen content also increases as its particle size decreases. Conversely, increasing its particle size deters realization of high density of the sintered body. Consequently, it is preferably in a range between 0.1 and 100 μm, more preferably 0.2 to 70 μm, still more preferably 5 to 50 μm.

The method of the present invention for producing a magnetostrictive material also uses Starting Material C containing T, where T is at least one metallic element selected from the group consisting of Fe, Co and Ni, as described earlier. Moreover, it may contain a transition metal which forms an alloy with a rare-earth metal of Tb, Dy or Ho. More specifically, the transition metals useful for the present invention include Mn, Cr, Mo or W.

Oxygen content of Starting Material C for the present invention is not limited, so long as it is in a range from 1000 to 7000 ppm.

Starting Material C preferably has a particle size (mean particle size) in a range from 0.5 to 100 μm. Its oxygen content also increases as its particle size decreases. Conversely, increasing its particle size deters realization of high density of the sintered body. Consequently, it is preferably in a range from 0.5 to 100 μm, more preferably 0.5 to 50 μm, still more preferably 0.5 to 30 μm.

The method of the present invention for producing a magnetostrictive material sinters a mixture of Starting Materials A, B and C to produce a magnetostrictive material represented by Formula 3 $(Tb_vDy_{1-v})T_w$, where $0.27 \leq v < 0.50$, and $1.70 \leq w \leq 2.00$. The magnetostrictive material may not exhibit a sufficient magnetostrictive value below room temperature when v is below 0.27, and may not exhibit a sufficient magnetostrictive value in the room temperature region when v is 0.50 or more. The magnetostrictive material may have a reduced magnetostrictive value when w does not fall within the above range, because of increased content of rare-earth-rich phases when w is below 1.70, and evolution of dissimilar phases, e.g., (Tb, Dy) T₃ phase when w is above 2.00. It is more preferably $0.27 \leq v \leq 0.40$, still more preferably $0.27 \leq v \leq 0.33$. Also, it is more preferably $1.80 \leq w \leq 1.95$, still more preferably $1.85 \leq w \leq 1.90$.

The mixing ratio of the Starting Materials A, B and C may be adequately set to have the magnetostrictive material composition represented by Formula 3. The ratio of Starting Material A is preferably at 50% by weight or more but below 100% by weight, more preferably 60 to 95% by weight, inclusive. Decreasing a Starting Material A content below 50% reduces degree of orientation of the sintered magnetostrictive material, because of insufficient orientation of the compact formed in a magnetic field. At an excessively high content of Starting Material A, which means an insufficient content of hydrogen-containing Starting Material B, the sintered magnetostrictive material may have an insufficient density, and also have an increased number or open pores to decrease its saturation magnetostriction value when it is in service for extended periods. The mixing ratio of Starting Material B at 40% by weight or less, preferably 5 to 30%, inclusive. At an excessively low content of B, the magnetostrictive material may not be sintered to have a high density. At an excessively high content of B, on the other hand, the magnetostrictive material may have a decreased saturation magnetostriction constant, because of an insufficient content of Starting Material A. The ratio of Starting Material C is set in consideration of the mixing ratio of Starting Material A and B so that the magnetostrictive material has the T content represented by formula 3.

Starting Materials A, B and C are weighed, mixed with each other and milled, as illustrated in FIG. 1. In the milling step, a milling machine may be adequately selected from a wet ball mill, attritor, atomizer and the like. Of these machines, an atomizer is particularly preferable, because it can apply an impact and shear stress simultaneously to the particles to prevent their agglomeration and hence enhance productivity. The mixture is formed into a compact of desired shape before sintering when the compacting is conducted in a magnetic field, to orient Starting Material A and the like in one direction and there by to orient the sintered magnetostrictive material along the [111] axis. The magnetic field applied has an intensity of $2.4 \times 10^4$ A/m or more, preferably $4.8 \times 10^4$ A/m or more. Direction of the magnetic field may be perpendicular to or in parallel to the direction of pressure. The compact is formed at a pressure of $4.9 \times 10^4$ Pa or more, preferably $2.9 \times 10^5$ Pa or more. It is sintered under adequate conditions. Specifically, it is recommended to fire the compact at 1100° C. or higher, preferably 1150 to 1250° C., for 1 to 10 hours, preferably in a non-oxidative atmosphere, e.g., in an inert gas atmosphere of Ar gas or the like, or under a vacuum.

The magnetostrictive material produced by the method of the present invention is polycrystalline, oriented along the [111] axis, the direction in which magnetostriction is exhibited most notably. It has a mean grain size of 10 μm or more. The material having a smaller mean grain size may have a low magnetization rate by an external magnetic field, because of increased content of the grain boundaries. There is no upper limit of the mean grain size. However, the magnetostrictive material has a magnetostrictive value essentially saturated at a mean grain size of 200 μm or more, and there is no need to increase the size beyond that level. Moreover, increasing the size beyond that level is impractical, because of excessively extended sintering time needed.

EXAMPLE 1

Tb, Dy and Fe were weighed to have a Starting Material A composition of $Tb_{0.4}Dy_{0.6}Fe_{1.95}$, and molten in an Ar gas atmosphere to prepare the starting alloy. It was annealed at 1170° C. for 20 hours to evenly distribute the constituent metals and, at the same time, to vanish separated dissimilar phases. Then, the annealed starting alloy was preliminarily milled by a Braun mill, and passed through a mesh to remove the coarse particles of 2 mm or more in size, to prepare the powder having a mean size of 500 μm, determined by an analyzer (Fisher's Subsieve Sizer). Starting Material A of varying oxygen content was prepared by changing powder handling conditions.

Its oxygen content was determined by analyzer (HORIBA's ZWGA-650A) and its hydrogen content was determined by analyzer (HORIBA's ZWGA-G21).

Next, Starting Material B was prepared, where Dy and Fe were weighed to have a composition of $Dy_{2.0}Fe$ (t=0.67), which was melted in an Ar gas atmosphere to prepare the starting alloy, and preliminarily milled by a Braun mill. Starting Material B thus prepared was treated at 150° C. for 1 hour in a hydrogen gas atmosphere to absorb hydrogen. This treatment causes hydrogen atoms to penetrate into the crystal lattices of the Starting Material B, or forms a hydride, and massively cracks the Starting Material B particles. Then, the Starting Material B particles were passed through a mesh to remove the coarse particles of 2 mm or more in size, to prepare the powder having a mean particle size of 500 μm. Starting Material B of varying oxygen content was prepared by changing powder handling conditions. It contained hydrogen at 17800 to 18200 ppm.

Next, Starting Material C was prepared, where Fe was reduction-treated at 300° C. for 1 hour in a hydrogen gas atmosphere to remove oxygen, to have a mean particle size of 8 μm. It contained oxygen at around 2000 ppm.

Starting Materials A, B and C were weighed and mixed with each other to have the following final compositions.

Composition a: $Tb_{0.36}Dy_{0.64}Fe_{1.87}$
Composition b: $Tb_{0.34}Dy_{0.66}Fe_{1.87}$
Composition c: $Tb_{0.30}Dy_{0.70}Fe_{1.87}$
Composition d: $Tb_{0.28}Dy_{0.72}Fe_{1.87}$ Each of Starting Materials A, B and C was milled in an Ar gas atmosphere by an atomizer (produced by Tokyo Atomizer Mfg. Co., Ltd.) to have the fine powders of 9 μm in mean particle size. A compact of 12 mm×12 mm×16 mm in size was prepared by compacting the fine powders at 8 tons/cm$^2$ in a magnetic field of 12 kOe in a transverse magnetic field, in which a magnetic field is applied in a direction perpendicular to the compressing direction. FIGS. 2 to 9 show the releasing pressure levels for the compacts, where the releasing pressure is defined as a maximum load under which the compressed compact is released from a die.

The resulting compact was sintered at 1235° C. for 3 hours in an Ar gas atmosphere.

The sintered body was measured for its magnetostrictive value ($\lambda_{1.0}$). The results are given in FIGS. 2 to 9, where the results given in FIGS. 2 and 3 are with the composition a, those in FIGS. 4 and 5 with the composition b, those in FIGS. 6 and 7 with the composition c, and those in FIGS. 8 and 9 with the composition d.

As shown in FIGS. 2, 4, 6 and 8, the magnetostrictive characteristics are improved as oxygen content of Starting Material A decreases. A magnetostrictive value ($\lambda_{1.0}$) of 1000 ppm or more can be attained by controlling the oxygen content at 3000 ppm or less. However, it is difficult to keep the oxygen content below 500 ppm on an industrial scale. Consequently, the oxygen content of Starting Material A is set at 500 to 3000 ppm for the present invention.

For Starting Material B, as shown in FIGS. 3, 5, 7 and 9, the releasing pressure decreases as oxygen content increases. When the content is in the range from 2000 to 7000 ppm recommended for the present invention, a magnetostrictive value ($\lambda_{1.0}$) of 1000 ppm or more can be secured while keeping a releasing pressure below 3.0 tons/cm$^2$.

What is claimed is:

1. A method for producing a magnetostrictive material, comprising sintering a mixture composed of Starting Materials A, B and C, where Starting Material A is represented by Formula 1 $(Tb_xDy_{1-x})T_y$ (T is at least one metallic element selected from the group consisting of Fe, Ni and Co, $0.35 < x \leq 0.50$ and $1.70 \leq y \leq 2.00$), Starting Material B is represented by Formula 2 $Dy_tT_{1-t}$ ($0.37 \leq t \leq 1.00$) and Starting Material C contains said T, to produce a magnetostrictive material represented by Formula 3 $(Tb_vDy_{1-v})T_w$ ($0.27 \leq v < 0.50$, and $1.70 \leq w \leq 2.00$), wherein the oxygen content of said Starting Material A is set at 500 to 3000 ppm and the oxygen content of said Starting Material B is from 2000 to 7000 ppm.

2. The method for producing a magnetostrictive material according to claim 1, wherein:
   the oxygen content of said Starting Material A is from 1000 to 2500 ppm.

3. The method for producing a magnetostrictive material according to claim 1, wherein:
   the oxygen content of said Starting Material B is from 3000 to 6000 ppm.

4. The method for producing a magnetostrictive material according to claim 1, wherein:
   the oxygen content of said Starting Material B is from 4000 to 5500 ppm.

5. The method for producing a magnetostrictive material according to claim 1, wherein:
   the oxygen content of said Starting Material C is from 500 to 3000 ppm.

6. The method for producing a magnetostrictive material according to claim 1, wherein:
   the hydrogen content of said Starting Material B is from 7000 to 22000 ppm.

* * * * *